(12) United States Patent
Choi et al.

(10) Patent No.: US 8,637,868 B2
(45) Date of Patent: Jan. 28, 2014

(54) THIN-FILM TRANSISTOR ARRAY SUBSTRATE, ORGANIC LIGHT EMITTING DISPLAY DEVICE INCLUDING THE SAME, AND METHOD OF MANUFACTURING THE SAME

(75) Inventors: Jong-Hyun Choi, Yongin (KR); Jae-Beom Choi, Yongin (KR)

(73) Assignee: Samsung Display Co., Ltd (KR)

( * ) Notice: Subject to any disclaimer, the term of this patent is extended or adjusted under 35 U.S.C. 154(b) by 0 days.

(21) Appl. No.: 13/429,846

(22) Filed: Mar. 26, 2012

(65) Prior Publication Data

US 2013/0112975 A1  May 9, 2013

(30) Foreign Application Priority Data

Nov. 7, 2011 (KR) .................. 10-2011-0115375

(51) Int. Cl.
*H01L 29/786* (2006.01)
*H01L 51/52* (2006.01)

(52) U.S. Cl.
USPC .......... 257/59; 257/72; 257/40; 257/E51.018; 438/151; 438/99

(58) Field of Classification Search
USPC ............. 438/99, 104, 151, 158; 257/40, 257/E51.018, E51.019
See application file for complete search history.

(56) References Cited

U.S. PATENT DOCUMENTS

2009/0278131 A1* 11/2009 Kwon et al. .................. 257/72
2011/0140114 A1    6/2011 Ko et al.
2013/0015459 A1*  1/2013 Lee et al. ..................... 257/72

FOREIGN PATENT DOCUMENTS

KR   10-2006-0000355   1/2006
KR   10-2011-065852    6/2011

* cited by examiner

*Primary Examiner* — Calvin Lee
*Assistant Examiner* — Scott Stowe
(74) *Attorney, Agent, or Firm* — Knobbe Martens Olson & Bear LLP

(57) ABSTRACT

A TFT array substrate including: a thin-film transistor including an active layer, gate, source and drain electrodes, a first insulation layer between the active layer and the gate electrode, and a second insulation layer between the gate and the source and drain electrodes; a pixel electrode on the first and second insulation layers, and connected to one of the source and drain electrodes; a capacitor including a first electrode on the same layer as the gate electrode, a second electrode formed of the same material as the pixel electrode, a first protection layer on the second electrode, and a second protection layer on the first protection layer; a third insulation layer between the second insulation layer and the pixel electrode, and between the first electrode and the second electrode; and a fourth insulation layer covering the source and drain electrodes and the second protection layer, and exposing the pixel electrode.

29 Claims, 6 Drawing Sheets

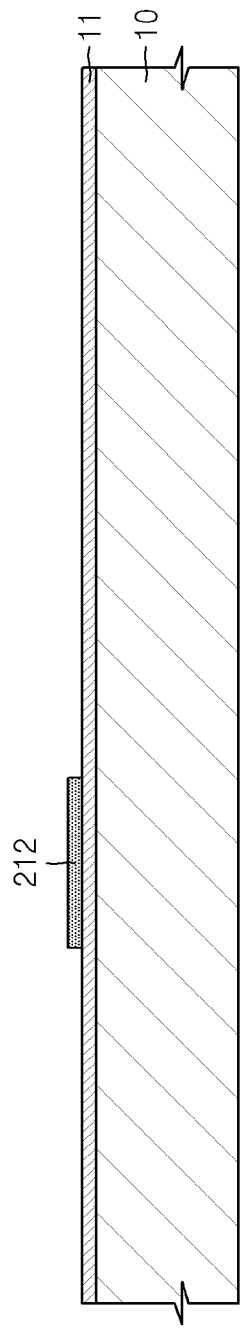
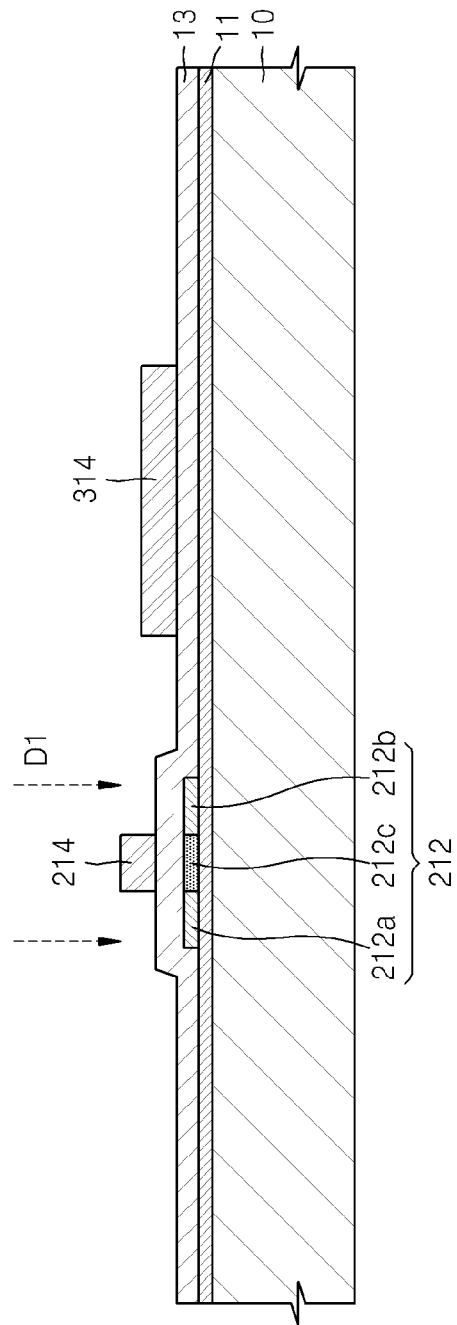

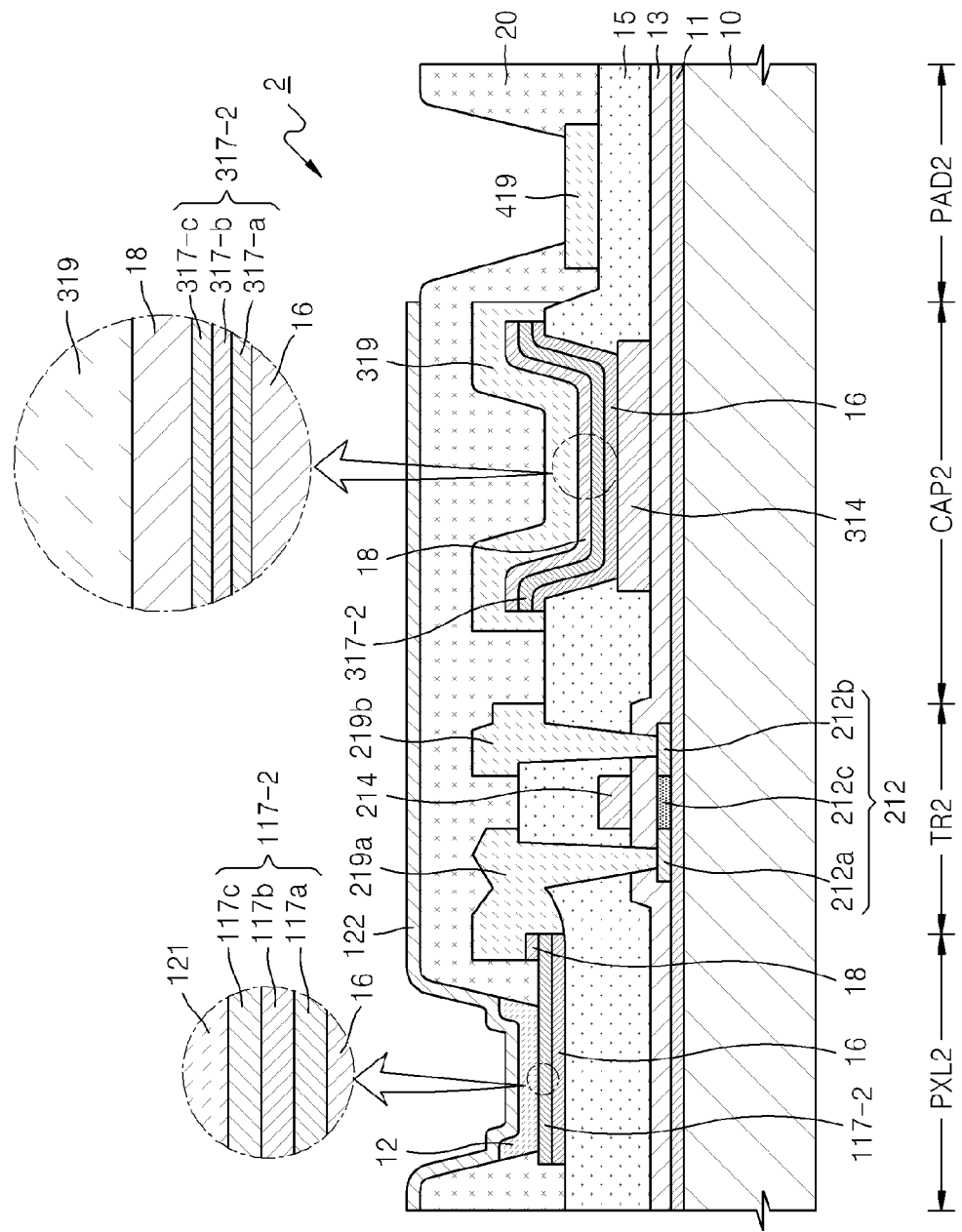

THIN-FILM TRANSISTOR ARRAY SUBSTRATE, ORGANIC LIGHT EMITTING DISPLAY DEVICE INCLUDING THE SAME, AND METHOD OF MANUFACTURING THE SAME

CROSS-REFERENCE TO RELATED APPLICATIONS

This application claims the benefit of Korean Patent Application No. 10-2011-0115375, filed on Nov. 7, 2011, in the Korean Intellectual Property Office, the disclosure of which is incorporated herein in its entirety by reference.

BACKGROUND

1. Field

The present disclosure relates to a thin-film transistor array substrate, an organic light emitting display device including the same, and a method of manufacturing the same.

2. Description of the Related Technology

A flat panel display device, such as an organic light emitting display device and a liquid crystal display device, generally includes a thin-film transistor (TFT), a capacitor, and wires connecting the TFT and the capacitor.

The flat panel display device is usually manufactured by forming a minute pattern of TFT, capacitor, and wire on a substrate via a photolithography process that transfers the minute pattern by using a mask.

According to the photolithography process, photoresist is uniformly coated on the substrate on which the minute pattern is to be formed, the photoresist is exposed to light by using an exposure device, such as a stepper, and then the exposed photoresist (when the photoresist is positive photoresist) is developed. After developing the photoresist, remaining photoresist is used to etch the minute pattern on the substrate, and the unnecessary photoresist is removed after forming the minute pattern.

As described above, since a mask having a necessary pattern is first prepared while transferring a pattern by using the mask, manufacturing costs for preparing the mask are increased as a number of processes using the mask is increased. Also, since above complex operations are performed, manufacturing processes are complex, a manufacturing time is increased, and the manufacturing costs are increased due to increased manufacturing time.

SUMMARY OF CERTAIN INVENTIVE ASPECTS

Embodiments of the present invention provide a thin-film transistor array substrate having simple manufacturing processes and excellent signal transmission, an organic light emitting display device including the same, and a method of manufacturing the same.

In accordance with one aspect, a thin-film transistor array substrate can include a thin-film transistor comprising an active layer, a gate electrode, source and drain electrodes, a first insulation layer disposed between the active layer and the gate electrode, and a second insulation layer disposed between the gate electrode and the source and drain electrodes; a pixel electrode disposed on the first and second insulation layers, and connected to one of the source and drain electrodes; a capacitor comprising a first electrode disposed on the same layer as the gate electrode, a second electrode formed of the same material as the pixel electrode, a first protection layer disposed on the second electrode, and a second protection layer disposed on the first protection layer; a third insulation layer disposed between the second insulation layer and the pixel electrode, and between the first electrode and the second electrode; and a fourth insulation layer covering the source and drain electrodes and the second protection layer, and exposing the pixel electrode.

The second insulation layer can not be disposed between the first and second electrodes.

A thickness of the third insulation layer can be thinner than a thickness of the second insulation layer.

A thickness of the third insulation layer can be from about 500 Å to about 2000 Å.

A dielectric constant of the third insulation layer can be higher than a dielectric constant of the first insulation layer.

The third insulation layer can comprise at least one selected from the group consisting of $SiN_x$, $SiO_2$, $ZrO_2$, $TiO_2$, $Ta_2O_5$, and $Al_2O_3$.

The first through third insulation layers can be sequentially disposed between the substrate and the pixel electrode in the stated order, wherein refractive indexes of adjacent insulation layers are different from each other.

The pixel electrode can comprise a transparent conductive oxide.

The transparent conductive oxide can comprise at least one selected from the group consisting of indium tin oxide (ITO), an indium zinc oxide (IZO), a zinc oxide (ZnO), an indium oxide ($In_2O_3$), an indium gallium oxide (IGO), and an aluminum zinc oxide (AZO).

The pixel electrode can further comprise a semi-transmission metal layer.

The semi-transmission metal layer can comprise at least one selected from the group consisting of silver (Ag), aluminum (Al), and alloys thereof.

The semi-transmission metal layer can be disposed between layers comprising the transparent conductive oxide.

The pixel electrode and the third insulation layer can have the same etching surface.

The third insulation layer, the second electrode, and the first protection layer can have the same etching surface.

The first protection layer can comprise at least one selected from the group consisting of Mo, an alloy comprising Mo, Ti, Cu, and Ag.

A connector of the source or drain electrode connected to the pixel electrode can be disposed higher than the electrode, and the first protection layer can be disposed between the pixel electrode and the connector.

The second protection layer can be formed of the same material as the source and drain electrodes.

The thin-film transistor array substrate can further comprise a pad electrode formed of the same material as the source and drain electrodes.

According to another aspect, an organic light emitting display device can include a thin-film transistor comprising an active layer, a gate electrode, source and drain electrodes, a first insulation layer disposed between the active layer and the gate electrode, and a second insulation layer disposed between the gate electrode and the source and drain electrodes; a pixel electrode disposed on the first and second insulation layers and connected to one of the source and drain electrodes; a capacitor comprising a first electrode disposed on the same layer as the gate electrode, a second electrode formed of the same material as the pixel electrode, a first protection layer disposed on the second electrode, and a second protection layer disposed on the first protection layer; a third insulation layer disposed between the second insulation layer and the pixel electrode, and between the first electrode and the second electrode; a fourth insulation layer covering the source and drain electrodes and the second protection layer, and exposing the pixel electrode; an organic light emitting layer disposed on the pixel electrode; and a counter electrode disposed on the organic light emitting layer.

The counter electrode can be a reflective electrode reflecting light emitted from the organic light emitting layer.

According to another aspect, a method of manufacturing a thin-film transistor array substrate can include forming a semiconductor layer on a substrate and forming an active layer of a thin-film transistor by patterning the semiconductor layer; forming a first insulation layer, forming a first conductive layer on the first insulation layer, and then forming a gate electrode of the thin-film transistor and a first electrode of a capacitor by patterning the first conductive layer; forming a second insulation layer and forming an opening in the second insulation layer such that source and drain regions of the active layer and the first electrode are exposed; sequentially forming a third insulation layer, a second conductive layer, and a third conductive layer, and forming a pixel electrode and a second electrode of the capacitor by simultaneously patterning the third insulation layer, the second conductive layer, and the third conductive layer; forming a fourth conductive layer, and forming source and drain electrodes and a second protection layer covering the second electrode by patterning the fourth conductive layer; and forming a fourth insulation layer and removing the fourth insulation layer such that the pixel electrode is exposed.

Ion impurities can be doped on the source and drain regions.

The method can comprise performing a first etching process by etching the third insulation layer, and performing a second etching process by etching the second and third conductive layers.

The second conductive layer can be formed of a layer comprising a transparent conductive oxide.

The second conductive layer can be formed to include a first layer comprising a transparent conductive oxide, a second layer comprising a semi-transmission metal, and a third layer comprising a transparent conductive oxide.

The third conductive layer remaining on the pixel electrode can be removed.

The fourth conductive layer can be used to further form a pad electrode.

The third insulation layer can be thinner than the second insulation layer.

The third insulation layer can be formed of a material having a higher dielectric constant than the first insulation layer.

BRIEF DESCRIPTION OF THE DRAWINGS

The above and other features and advantages of the present invention will become more apparent by describing in detail certain embodiments with reference to the attached drawings in which:

FIG. 2 is a cross-sectional view for describing an embodiment of a first mask process of the organic light emitting display device of FIG. 1;

FIG. 3 is a cross-sectional view for describing an embodiment of a second mask process of the organic light emitting display device of FIG. 1;

FIG. 8 is a cross-sectional view schematically illustrating another embodiment of an organic light emitting display device.

DETAILED DESCRIPTION OF CERTAIN INVENTIVE EMBODIMENTS

Hereinafter, embodiments of the present invention will be described with reference to accompanying drawings. As used herein, the term "and/or" includes any and all combinations of one or more of the associated listed items.

Figure 1:
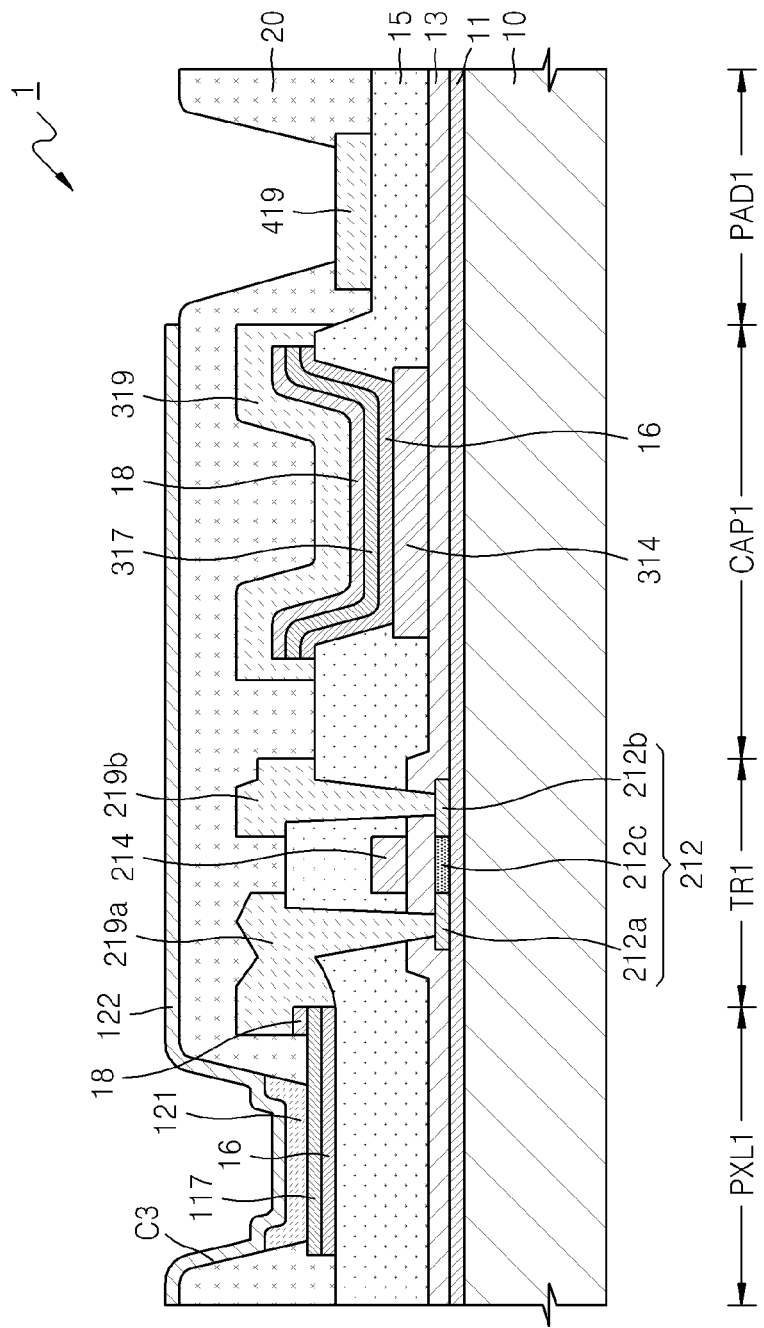
FIG. 1 is a cross-sectional view schematically illustrating an embodiment of an organic light emitting display device.

FIG. 1 is a cross-sectional view schematically illustrating an embodiment of an organic light emitting display device 1.

Referring to FIG. 1, the organic light emitting display device 1 includes a pixel region PXL1, a transistor region TR1, a capacitor region CAP1, and a pad region PAD1 on a substrate 10.

The substrate 10 can be a transparent substrate, such as a glass substrate or a plastic substrate including polyethylene terephthalate (PET), polyethylene naphthalate (PEN), or polyimide.

A buffer layer 11 can be disposed on the substrate 10. The buffer layer 11 is used to form a flat surface on the substrate 10 and block impure elements from penetrating into the substrate 10, and can include a single or multiple layers formed of silicon nitride and/or silicon oxide.

An active layer 212 is disposed on the buffer layer 11. The active layer 212 can be formed of semiconductor including amorphous silicon or poly silicon. The active layer 212 can include a channel region 212c and source and drain regions 212a and 212b doped with ion impurities outside the channel region 212c.

A gate electrode 214 is disposed on the active layer 212 at a location corresponding to the channel region 212c of the active layer 212, wherein a first insulation layer 13 constituting a gate insulation film is disposed between the active layer 212 and the gate electrode 214. The gate electrode 214 can include a single or multiple layers formed of at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A source electrode 219a and a drain electrode 219b respectively connected to the source region 212a and the drain region 212b of the active layer 212 are disposed on the gate electrode 214, wherein a second insulation layer 15 constituting an interlayer insulation film is disposed between the gate electrode 214 and the source and drain electrodes 219a and 219b. The source and drain electrodes 219a and 219b can include a single or multiple layers formed of at least one metal selected from among Al, Pt, Pd, Ag, Mg, Au, Ni, Nd, Ir, Cr, Li, Ca, Mo, Ti, W, and Cu.

A fourth insulation layer 20 is disposed on the second insulation layer 15 to cover the source and drain electrodes 219a and 219b.

In some embodiments, the first insulation layer 13 is used as a gate insulation film in the transistor region TR1 and the second insulation layer 15 is used as an interlayer insulation film. The first and second insulation layers 13 and 15 can be formed of an inorganic insulation material. Examples of the inorganic insulation material forming the first and second insulation layers 13 and 15 include $SiO_2$, $SiN_x$, $SiON$, $Al_2O_3$, $TiO_2$, $Ta_2O_5$, $HfO_2$, $ZrO_2$, BST, and PZT.

Since the first insulation layer 13 used as a gate insulation film is not used as a dielectric film of a capacitor (described below), the first insulation layer 13 can be designed only according to characteristics of a gate insulation film of a thin-film transistor without having to consider dielectric constant characteristics of a capacitor. For example, when silicon nitride ($SiN_x$) often used to form a dielectric film of a capacitor to increase electrostatic capacity of the capacitor is simultaneously used to form a gate insulation film of a thin-film transistor, a leakage current can be generated in the thin-film transistor. However, since a dielectric film of a capacitor and a gate insulation film of a thin-film transistor are separately formed in disclosed embodiments, the dielectric film and the gate insulation film can be formed by only respectively considering characteristics of the capacitor and characteristics of the thin-film transistor.

A pixel electrode 117 formed of the same material as a second electrode 317 to be described later is disposed on the substrate 10, the buffer layer 11, the first insulation layer 13, and the second insulation layer 15 in the pixel region PXL1. A third insulation layer 16 is disposed between the pixel electrode 117 and the second insulation layer 15. The buffer layer 11, the first insulation layer 13, the second insulation layer 15, and the third insulation layer 16 are disposed in the stated order from the substrate 10 to the pixel electrode 117 between the pixel electrode 117 and the substrate 10.

Refractive indexes of adjacent layers in the buffer layer 11, the first insulation layer 13, the second insulation layer 15, and the third insulation layer 16 disposed between the substrate 10 and the pixel electrode 117 can be different from each other. Insulation layers having different refractive indexes can be alternately disposed to operate as a distributed brag reflector (DBR) so as to increase light efficiency of light emitted from an organic light emitting layer 121. The buffer layer 11, the first insulation layer 13, the second insulation layer 15, and the third insulation layer 16 are shown in FIG. 1 as if each of them is formed of one layer, but in other embodiments, they can be formed of a plurality of layers.

The pixel electrode 117 is directly disposed on the third insulation layer 16. As described below, since the third insulation layer 16 and the pixel electrode 117 are patterned by using the same mask in the same mask process, the third insulation layer 16 and the pixel electrode 117 have the same etching surface.

The pixel electrode 117 can be formed of a transparent conductive material so that light is emitted toward the pixel electrode 117. The transparent conductive material can include at least one selected from the group consisting of indium tin oxide (ITO), indium zinc oxide (IZ), zinc oxide (ZnO), indium oxide ($In_2O_3$), indium gallium oxide (IGO), and aluminum zinc oxide (AZO).

The fourth insulation layer 20 is formed outside the pixel electrode 117, and an opening C3 exposing the pixel electrode 117 is formed in the fourth insulation layer 20. The organic light emitting layer 121 is disposed in the opening C3.

The organic light emitting layer 121 can be formed of a low molecular organic material or a high molecular organic material. If the organic light emitting layer 121 is formed of the low molecular organic material, a hole transport layer (HTL), a hole injection layer (HIL), an electron transport layer (ETL), and an electron injection layer (EIL) can be stacked on each other based on the organic light emitting layer 121. Also, other various layers can be stacked if required. Examples of the low molecular organic material include copper phthalocyanine (CuPc), N'-di(naphthalene-1-yl)-N, N'-diphenyl-benzidine (NPB), and tris-8-hydroxyquinoline aluminum (Alq3). In other embodiments, if the organic light emitting layer 121 is formed of the high molecular organic material, the HTL can be included as well as the organic light emitting layer 121. The HTL can be formed of poly-(3,4)-ethylene-dihydroxy thiophene (PEDOT) or polyaniline (PANT). Here, examples of the high molecular organic materials include poly-phenylenevinylene (PPV) and polyfluorene. Further, an inorganic material can be disposed between the organic light emitting layer 121 and pixel electrode 117, and a counter electrode 122.

The counter electrode 122 is disposed as a common electrode on the organic light emitting layer 121. In the organic light emitting display device 1, the pixel electrode 117 can be used as an anode and the counter electrode 122 is used as a cathode, but polarities thereof can be opposite in other embodiments.

The counter electrode 122 can be a reflective electrode including a reflective material. The counter electrode 122 can include at least one material from among Al, Mg, Li, Ca, LiF/Ca, and LiF/Al. When the counter electrode 122 is a reflective electrode, light emitted from the organic light emitting layer 121 can be reflected at the counter electrode 122, penetrated through the pixel electrode 117 formed of the transparent conductive material, and emitted toward the substrate 10.

The fourth insulation layer 20 covering outside the pixel electrode 117 operates as a pixel definition film between the pixel electrode 117 and the counter electrode 122.

The fourth insulation layer 20 can be formed of an organic insulation film. The fourth insulation layer 20 can include a general-purpose polymer, such as polymethyl methacrylate (PMMA) or polystyrene (PS), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, or a blend thereof.

The fourth insulation layer 20 covers the source and drain electrodes 219a and 219b of the thin-film transistor described above, and one of the source and drain electrodes 219a and 219b is electrically connected to the pixel electrode 117.

A connector from among the source and drain electrodes 219a and 219b connected to the pixel electrode 117 is disposed on the pixel electrode 117. A first protection layer 18 protecting the pixel electrode 117 id disposed between the pixel electrode 117 and the connector. The first protection layer 18 is first formed throughout the entire top of the pixel electrode 117 so as to prevent the pixel electrode 117 from being damaged before the source and drain electrodes 219a and 219b are formed, and is removed and partially left in a portion connected to the pixel electrode 117 while the source and drain electrodes 219a and 219b are formed.

The capacitor region CAP1 includes a first electrode 314, the second electrode 317, the third insulation layer 16 disposed between the first and second electrodes 314 and 317, the first protection layer 18 protecting the second electrode 317, and a second protection layer 319 protecting the first protection layer 18.

The first electrode 314 is formed of the same material and during the same mask process as the gate electrode 214.

The second electrode 317 is formed of the same material as the pixel electrode 117. The second electrode 317 can include a transparent conductive oxide.

The first protection layer 18 is disposed on the second electrode 317. The first protection layer 18 prevents the second electrode 317 from being damaged before the source and drain electrodes 219a and 219b are formed. The first protection layer 18 can include at least one selected from among Mo, an alloy including Mo, Ti, Cu, and Ag. In other embodiments, other conductive materials may be used.

The second protection layer 319 is disposed on the first protection layer 18. The second protection layer 319 prevents the first protection layer 18 from being removed while the source and drain electrodes 219a and 219b are formed. The second protection layer 319 can be formed of the same material as the source and drain electrodes 219a and 219b.

In some embodiments, since both the first protection layer 18 and the second protection layer 319 include a conductive material and electrically contact the second electrode 317, the first and second protection layers 18 and 319 can form an upper electrode of the capacitor along with the second electrode 317.

The third insulation layer 16 constituting a dielectric film is disposed between the first and second electrodes 314 and 317. In some embodiments, the second insulation layer 15 disposed between the gate electrode 214 and the source and drain electrodes 219a and 219b is not disposed between the first and second electrodes 314 and 317 of the capacitor. Since the second insulation layer 15 operates as an interlayer insulation film of the thin-film transistor, the second insulation layer 15 is designed to have a thickness above a predetermined thickness, but since electrostatic capacity of the capacitor decreases as a thickness of the dielectric film increases, the electrostatic capacity can decrease when the dielectric film has the same thickness as the interlayer insulation film. In some embodiments, the second insulation layer 15 is not used as the dielectric film of the capacitor and the third insulation layer 16 used as the dielectric film can be thinner than the second insulation layer 15, the electrostatic capacity can be prevented from being decreased. The third insulation layer 16 can have a thickness from about 500 Å to about 2000 Å to maintain suitable electrostatic capacity.

The third insulation layer 16 used as the dielectric film can be formed of an insulation material having a high dielectric constant. As described above, since the third insulation layer 16 is formed separately from the first insulation layer 13 forming the gate insulation film, the electrostatic capacity can be increased by forming the third insulation layer 16 with a material having a higher dielectric constant than the first insulation layer 13. Accordingly, since the electrostatic capacity is increased without having to increase an area of the capacitor, an area of the pixel electrode 117 can be relatively increased, thereby increasing an aperture ratio of the organic light emitting display device 1. The third insulation layer 16 can be an inorganic insulation film. For example, the third insulation layer 16 can be formed of a material selected from the group consisting of $SiO_2$, $SiN_x$, $SiON$, $Al_2O_3$, $TiO_2$, $Ta_2O_5$, $HfO_2$, $ZrO_2$, BST, and PZT.

Also, as described below, the second electrode 317, the third insulation layer 16, and the first protection layer 18 can have the same etching surface since they are patterned during the same mask process.

The fourth insulation layer 20 is disposed on the second electrode 317. The fourth insulation layer 20 can be an organic insulation film. By disposing the fourth insulation layer 20 including an organic insulation material having a low dielectric constant between the counter electrode 122 and the second electrode 317, parasitic capacity generated between the counter electrode 122 and the second electrode 317 is reduced, thereby preventing signal interference due to the parasitic capacity.

The pad region PAD1 including a pad electrode 419 constituting a connection terminal of an external driver is disposed outside the organic light emitting display device 1.

In some embodiments, the pad electrode 419 can be formed of the same material as the source and drain electrodes 219a and 219b. Also, the pad electrode 419 is disposed on the same layer as the source and drain electrodes 219a and 219b. The pad electrode 419 is disposed directly on the second insulation layer 15.

Since the pad electrode 419 is formed later than the gate electrode 214, the pixel electrode 117, and the first electrode 314 described above, a material forming the gate electrode 214, pixel electrode 117, or first electrode 314 is not disposed on the pad electrode 419. Reliability of the pad electrode 419 is prevented from being deteriorated due to the material forming the gate electrode 214, pixel electrode 117, or first electrode 314 existing on the pad electrode 419 or due to a process of removing such a material on the pad electrode 419.

Although not shown in FIG. 1, the organic light emitting display device 1 can further include an encapsulation member (not shown) encapsulating a display region including the pixel region PXL1, capacitor region CAP1, and transistor region TR1. The encapsulation member can be formed of a substrate including a glass material, a metal film, or an encapsulation thin film in which an organic insulation film and an inorganic insulation film are alternately stacked on each other.

An embodiment of a method of manufacturing the organic light emitting display device 1 will now be described with reference to FIGS. 2 through 7.

FIG. 2 is a cross-sectional view for describing an embodiment of a first mask process of the organic light emitting display device 1 of FIG. 1.

Referring to FIG. 2, the buffer layer 11 and a semiconductor layer (not shown) are sequentially formed on the substrate 10, and the semiconductor layer is patterned to form the active layer 212 of the thin-film transistor.

Although not shown in FIG. 2, the semiconductor layer is deposited on the substrate 10, photoresist (not shown) is coated on the semiconductor layer, and the semiconductor layer is patterned by a photolithography process using a first photo mask (not shown), thereby forming the active layer 212 described above. The first mask process using the photolithography process is performed via a series of processes, such as exposing the first photo mask to light using an exposure device, and then developing, etching, and stripping or ashing the first photo mask.

The semiconductor layer can include amorphous silicon or poly silicon. The poly silicon can be formed by crystallizing amorphous silicon. The amorphous silicon can be crystallized by using any method, such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method.

FIG. 3 is a cross-sectional view for describing an embodiment of a second mask process of the organic light emitting display device 1 of FIG. 1.

Referring to FIG. 3, the first insulation layer 13 and a first conductive layer (not shown) are sequentially stacked on the product of the first mask process of FIG. 2, and are patterned.

The first insulation layer 13 can be formed of an inorganic insulation film selected from among $SiO_2$, $SiN_x$, $SiON$, Al2O3, TiO2, Ta2O5, HfO2, ZrO2, BST, and PZT, and the first conductive layer can be a single or multiple layers formed of at least one metal selected from the group consisting of Al, Pt, Pd, Ag, Mg, Au, Ni, Nd, Ir, Cr, Li, Ca, Mo, Ti, W, and Cu.

After the patterning, the gate electrode 214 and the first electrode 314 of the capacitor are formed on the first insulation layer. The first insulation layer 13 operates as a gate insulation film but does not operate as a dielectric film of the capacitor. Thus, a material of the first insulation layer 13 can be selected by only considering characteristics of the thin-film transistor and not characteristics of the capacitor.

The ion impurities are doped (D1) on the above structure. B or P-ions can be doped as the ion impurities, and here, the ion impurities can be doped on the active layer 212 of the thin-film transistor in concentration equal to or above about $1 \times 10^{15}$ atoms/cm$^2$. At this time, the gate electrode 214 is operated as a self-align mask to dope the ion impurities on the active layer 212. As a result, the active layer 212 includes the source and drain regions 212a and 212b, and the channel region 212c therebetween, which are doped with the ion impurities.

Figure 4:
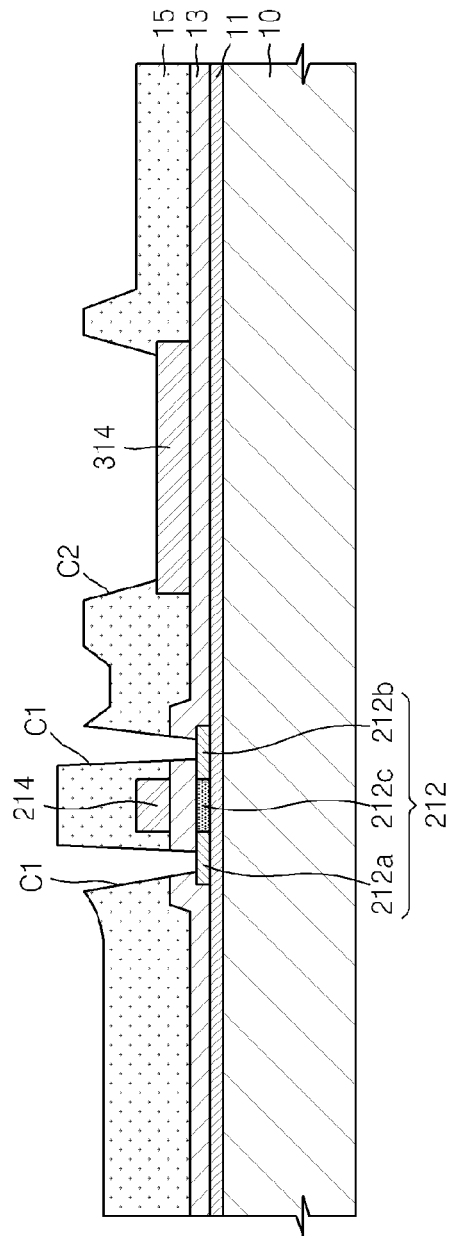
FIG. 4 is a cross-sectional view for describing an embodiment of a third mask process of the organic light emitting display device of FIG. 1.

FIG. 4 is a cross-sectional view for describing an embodiment of a third mask process of the organic light emitting display device 1 of FIG. 1.

Referring to FIG. 4, the second insulation layer 15 is formed on the product of the second mask process of FIG. 3, and the second insulation layer 15 is patterned to form an opening C1 exposing parts of the source and drain regions 212a and 212b of the active layer 212, and an opening C2 exposing the first electrode 314.

The second insulation layer 15 can include an inorganic insulation film formed of a material selected from among SiO2, SiNx, SiON, Al2O3, TiO2, Ta2O5, HfO2, ZrO2, BST, and PZT, and can be formed of a material having different refractive index from a material forming the first insulation layer 13 described above.

Figure 5:
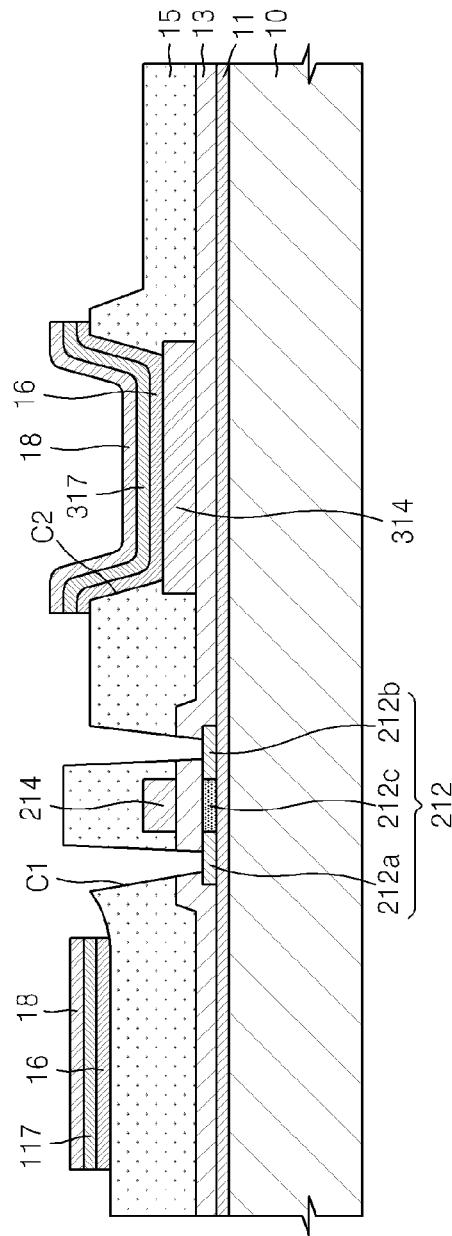
FIG. 5 is a cross-sectional view for describing an embodiment of a fourth mask process of the organic light emitting display device of FIG. 1.

FIG. 5 is a cross-sectional view for describing an embodiment of a fourth mask process of the organic light emitting display device 1 of FIG. 1.

Referring to FIG. 5, the third insulation layer 16, a second conductive layer (not shown), and a third conductive layer (not shown) are sequentially formed on the result product of the third mask process of FIG. 4, and then the third insulation layer 16, the second conductive layer, and the third conductive layer are simultaneously patterned.

The third insulation layer 16 operates as a dielectric film, and can be formed of an inorganic insulation material selected from among SiO2, SiNx, SiON, Al2O3, TiO2, Ta2O5, HfO2, ZrO2, BST, and PZT. However, in order to operate as a DBR, the third insulation layer 16 can be formed of a material having a different refractive index from those of the first and second insulation layers 13 and 15.

The second conductive layer can be formed of a transparent conductive oxide. Examples of the transparent conductive oxide include ITO, IZO, ZnO, In2O3, IGO, and AZO.

The third conductive layer protects the pixel electrode 117 and the second electrode 317, and can be formed of at least one material selected from among Mo, an alloy including Mo, Ti, Cu, and Ag.

As a result of patterning, the pixel electrode 117 and the first protection layer 18 having the same etching surface as the third insulation layer 16 are formed in a pixel region and the second electrode 317 and the first protection layer 18 having the same etching surface as the third insulation layer 16 are formed in a capacitor region.

Since the third insulation layer 16, the second conductive layer, and the third conductive layer are etched during the same mask process, the third insulation layer 16, the pixel electrode 117, and the first protection layer 18 have the same etching surface in the pixel region, and the third insulation layer 16, the second electrode 317, and the first protection layer 18 have the same etching surface in the capacitor region.

The third insulation layer 16 operates as a dielectric film by being directly disposed between the first electrode 314 and the second electrode 317, but does not operate as a gate insulation film since the third insulation layer 16 is not disposed on the thin-film transistor. Accordingly, the material or thickness of the third insulation layer 16 is selected by only considering the characteristics of the capacitor and not the characteristics of the thin-film transistor, and thus a degree of freedom of designing processes is increased.

Figure 6:
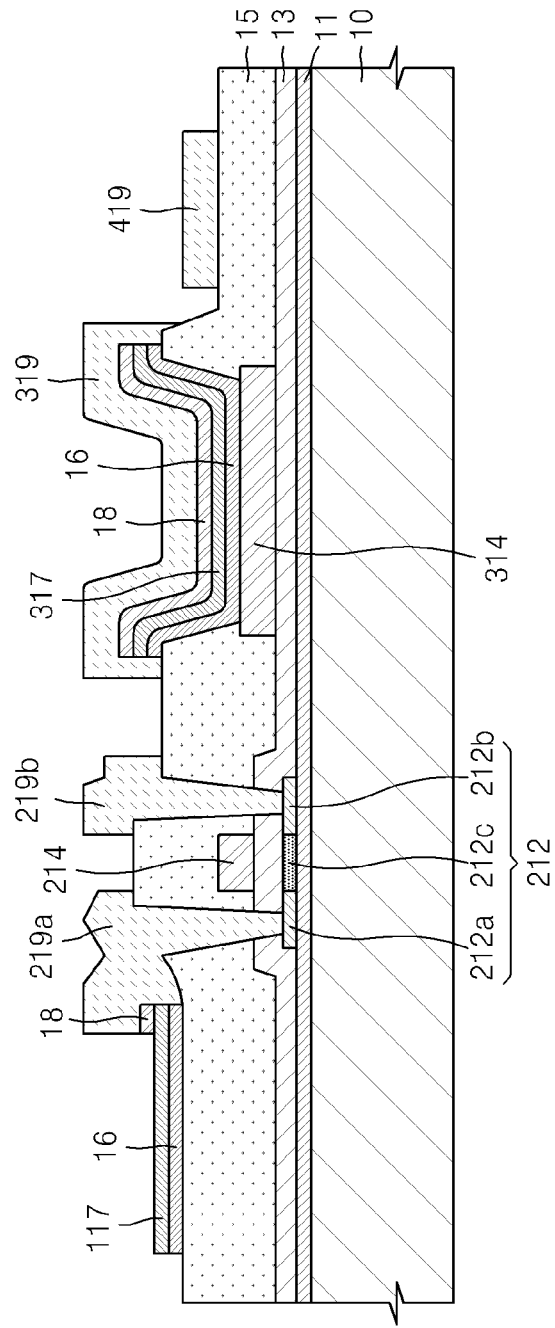
FIG. 6 is a cross-sectional view for describing an embodiment of a fifth mask process of the organic light emitting display device of FIG. 1.

FIG. 6 is a cross-sectional view for describing an embodiment of a fifth mask process of the organic light emitting display device 1 of FIG. 1.

Referring to FIG. 6, a fourth conductive layer (not shown) is formed on the product of the fourth mask process of FIG. 5, and patterned to form the source and drain electrodes 219a and 219b, the second protection layer 319, and the pad electrode 419.

The fourth conductive layer can be a single or multi layers formed of at least one metal selected from among Al, Pt, Pd, Ag, Mg, Au, Ni, Nd, Ir, Cr, Li, Ca, Mo, Ti, W, and Cu.

One of the source and drain electrodes 219a and 219b is electrically connected to the pixel electrode 117. In some embodiments, since the source and drain electrodes 219a and 219b are patterned after the pixel electrode 117 is formed, the connector of the source or drain electrode 219a or 219b connected to the pixel electrode 117 is formed higher than the pixel electrode 117. Also, while patterning the source and drain electrodes 219a and 219b, the first protection layer 18 disposed on the pixel electrode 117 is removed, and the first protection layer 18 between the pixel electrode 117 and the connector is left. However, the fourth conductive layer in the capacitor region is patterned to cover the first protection layer 18, thereby forming the second protection layer 319.

Although not shown in detail, the fourth conductive layer can be patterned in the fifth mask process to simultaneously form a data wire.

Figure 7:
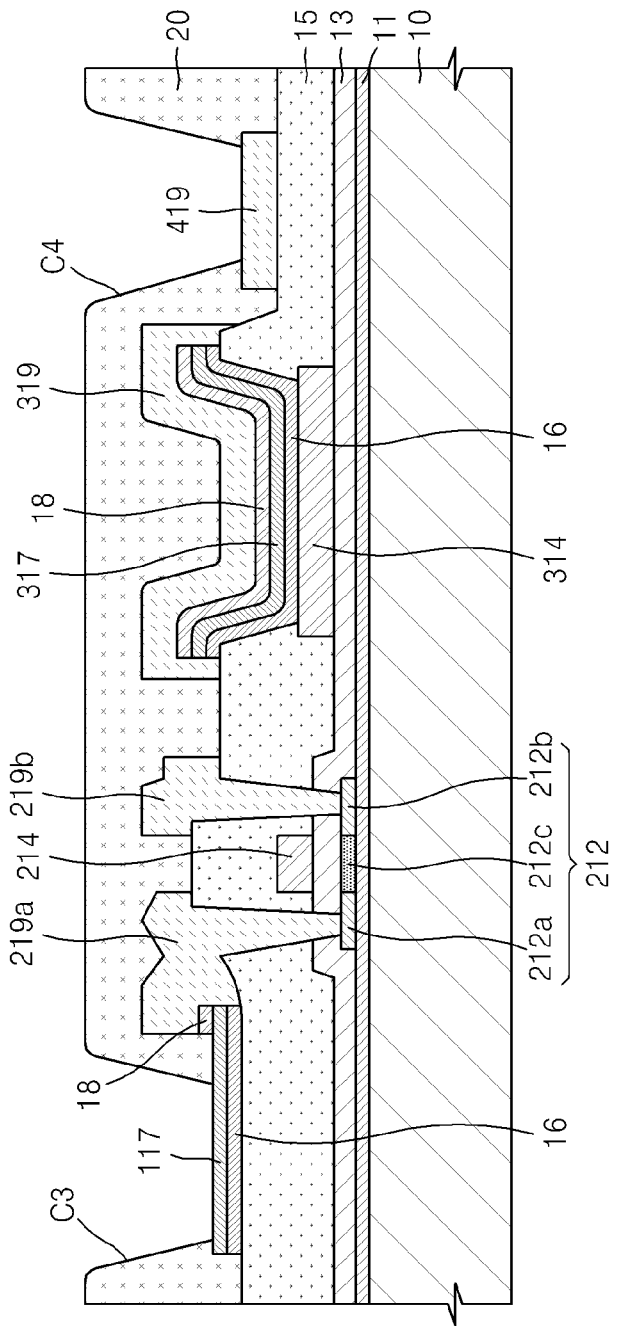
FIG. 7 is a cross-sectional view for describing an embodiment of a sixth mask process of the organic light emitting display device of FIG. 1.

FIG. 7 is a cross-sectional view for describing an embodiment of a sixth mask process of the organic light emitting display device 1 of FIG. 1.

Referring to FIG. 7, the fourth insulation layer 20 is formed on the product of the fifth mask process of FIG. 6, and then patterned to form the opening C3 exposing the top of the pixel electrode 117 and an opening C4 exposing the pad electrode 419.

The fourth insulation layer 20 can be an organic insulation film. Specifically, if the fourth insulation layer 20 is a photosensitive organic insulation film, separate photoresist need not be used.

As well as defining a light emitting region, the opening C3 exposing the pixel electrode 117 can increase an interval between an edge of the pixel electrode 117 and the counter electrode 122 of FIG. 1 to prevent a phenomenon where an electric field is concentrated in the edge of the pixel electrode 117, thereby preventing the pixel electrode 117 and the counter electrode 122 from being short-circuited.

Although not illustrated, the organic light emitting layer 121 can be formed on the pixel electrode 117 after the sixth mask process, and then the counter electrode 122 of FIG. 1 constituting a common electrode can be formed on the organic light emitting layer 121 to form the organic light emitting display device 1 of FIG. 1. Also, an encapsulation member (not shown) can be further formed on the counter electrode 122 of FIG. 1.

Another embodiment of an organic light emitting display device 2 will now be described with reference to FIG. 8. The differences between the organic light emitting display devices 1 and 2 will be mainly described.

FIG. 8 is a cross-sectional view schematically illustrating another embodiment of the organic light emitting display device 2.

Referring to FIG. 8, the organic light emitting display device 2 includes a pixel region PXL2, a transistor region TR2, a capacitor region CAP2, and a pad region PAD2 on the substrate 10. The transistor region TR2 and the pad region PAD2 are identical to those of the organic light emitting display device 1.

In the pixel region PXL2, a pixel electrode 117-2 is disposed on the substrate 10, the buffer layer 11, the first insulation layer 13, the second insulation layer 15, and the third insulation layer 16. The organic light emitting layer 121 is disposed on the pixel electrode 117-2, and light emitted from the organic light emitting layer 121 is emitted toward the substrate 10 through the pixel electrode 117-2.

In the organic light emitting display device 2, the pixel electrode 117-2 includes a first layer 117a including a transparent conductive oxide, a second layer 117b including a semi-transmission metal, and a third layer 117c including a transparent conductive oxide.

The transparent conductive oxide forming the first and third layers 117a and 117c can be selected from among ITO, IZO, ZnO, In2O3, IGO, and AZO. The semi-transmission metal forming the second layer 117b can be selected from among Ag, Al, and alloys thereof.

The first layer 117a including the transparent conductive oxide can decrease an adhesion stress between the third insulation layer 16 and the second layer 117b including the semi-transmission metal, and the third layer 117c including the transparent conductive oxide can decrease a work function difference between the second layer 117b including the semi-transmission metal and the organic light emitting layer 121, for example, between organic films such as HIL.

The counter electrode 122 operates as a reflection mirror and the second layer 117b including the semi-transmission metal operates as a semi-transmission mirror, and thus the light emitted from the organic light emitting layer 121 resonates between the counter electrode 122 and the second layer 117b including the semi-transmission metal. Accordingly, the organic light emitting display device 2 has not only a resonance effect by a DBR of the first through third insulation layers 13 through 16 disposed below the pixel electrode 117-2, but also increased light efficiency as a resonance effect by a mirror is added. In order for the second layer 117b including the semi-transmission metal to operate as a resonance mirror, the thickness of the second layer 117b can be below or equal to about 300 Å.

The pixel electrode 117-2 is electrically connected to one of the source and drain electrodes 219a and 219b, and the source and drain electrodes 219a and 219b are disposed on the pixel electrode 117-2. The first protection layer 18 protecting the third layer 117c is disposed between the pixel electrode 117-2 and the connector, specifically between the third layer 117c and the connector. The first protection layer 18 is formed on the entire top surface of the third layer 117c of the pixel electrode 117-2 to prevent the pixel electrode 117-2, specifically the third layer 117c, from being damaged before a process of forming the source and drain electrodes 219a and 219b, and is removed and partially left in a portion connected to the pixel electrode 117-2 after the source and drain electrodes 219a and 219b are formed.

The capacitor region CAP2 includes the substrate 10, the buffer layer 11, and the first insulation layer 13, and the first electrode 314, the third insulation layer 16, a second electrode 317-2, the first protection layer 18, and the second protection layer 319 are sequentially stacked on the first insulation layer 13.

The second electrode 317-2 includes a first layer 317a including a transparent conductive oxide, a second layer 317b including a semi-transmission metal, and a third layer 317c including a transparent conductive oxide, which is identical to the structure of the pixel electrode 117-2.

The first protection layer 18 is entirely formed on the second electrode 317-2. The first protection layer 18 is formed on the entire top of the third layer 117c of the second electrode 317-2 before the source and drain electrodes 219a and 219b are formed to prevent the second electrode 317-2, specifically the third layer 317c, from being damaged.

The second protection layer 319 is formed on the first protection layer 18. The second protection layer 319 can prevent the first protection layer 18 from being removed while the source and drain electrodes 219a and 219b are formed.

The thin-film transistor array substrate, the organic light emitting display device including the same, and the method of manufacturing the same according to embodiments of the present invention provide following effects.

First, since a dielectric film of a capacitor and a gate insulation film of a thin-film transistor are formed as separate insulation layers, insulation layers can be designed according to characteristics of the capacitor and thin-film transistor.

Second, since it is easy to control a thickness of the dielectric film of the capacitor, an aperture ratio can be increased.

Third, a pixel electrode can be protected during a process. Also, a resonance structure can be easily applied when the pixel electrode is a semi-transmission electrode.

Fourth, since a pad electrode is formed during a post-process, reliability of the pad electrode can be not decreased.

Fifth, the thin-film transistor array substrate and organic light emitting display device described above can be manufactured via a six mask processes.

While the present invention has been particularly shown and described with reference to certain embodiments thereof, it will be understood by those of ordinary skill in the art that various changes in form and details can be made therein without departing from the spirit and scope of the present invention as defined by the following claims.

What is claimed is:

1. An organic light emitting display device comprising:
   a thin-film transistor comprising:
      an active layer,
      a gate electrode,
      source and drain electrodes,
      a first insulation layer disposed between the active layer and the gate electrode, and
      a second insulation layer disposed between the gate electrode and the source and drain electrodes;
   a pixel electrode disposed on the first and second insulation layers and connected to one of the source and drain electrodes;
   a capacitor comprising:
      a first electrode disposed on the same layer as the gate electrode,
      a second electrode formed of the same material as the pixel electrode,
      a first protection layer disposed on the second electrode, and a second protection layer disposed on the first protection layer;

a third insulation layer disposed between the second insulation layer and the pixel electrode, and between the first electrode and the second electrode;

a fourth insulation layer covering the source and drain electrodes and the second protection layer, and exposing the pixel electrode;

an organic light emitting layer disposed on the pixel electrode; and a counter electrode disposed on the organic light emitting layer.

2. The organic light emitting display device of claim 1, wherein the counter electrode is a reflective electrode reflecting light emitted from the organic light emitting layer.

3. A thin-film transistor array substrate comprising:
a thin-film transistor comprising:
an active layer,
a gate electrode,
source and drain electrodes,
a first insulation layer disposed between the active layer and the gate electrode, and
a second insulation layer disposed between the gate electrode and the source and drain electrodes;
a pixel electrode disposed on the first and second insulation layers, and connected to one of the source and drain electrodes;
a capacitor comprising:
a first electrode disposed on the same layer as the gate electrode,
a second electrode formed of the same material as the pixel electrode,
a first protection layer disposed on the second electrode, and
a second protection layer disposed on the first protection layer;
a third insulation layer disposed between the second insulation layer and the pixel electrode, and between the first electrode and the second electrode; and
a fourth insulation layer covering the source and drain electrodes and the second protection layer, and exposing the pixel electrode.

4. The thin-film transistor array substrate of claim 3, wherein the second insulation layer is not disposed between the first and second electrodes.

5. The thin-film transistor array substrate of claim 3, wherein a thickness of the third insulation layer is thinner than a thickness of the second insulation layer.

6. The thin-film transistor array substrate of claim 3, wherein the third insulation layer comprises at least one selected from the group consisting of SiNx, SiO2, ZrO2, TiO2, Ta2O5, and Al2O3.

7. The thin-film transistor array substrate of claim 3, wherein the first through third insulation layers are sequentially disposed between the substrate and the pixel electrode in the stated order, wherein refractive indexes of adjacent insulation layers are different from each other.

8. The thin-film transistor array substrate of claim 3, wherein the pixel electrode and the third insulation layer have the same etching surface.

9. The thin-film transistor array substrate of claim 3, wherein the third insulation layer, the second electrode, and the first protection layer have the same etching surface.

10. The thin-film transistor array substrate of claim 3, wherein the second protection layer is formed of the same material as the source and drain electrodes.

11. The thin-film transistor array substrate of claim 3, further comprising a pad electrode formed of the same material as the source and drain electrodes.

12. The thin-film transistor array substrate of claim 3, wherein a thickness of the third insulation layer is from about 500 Å to about 2000 Å.

13. The thin-film transistor array substrate of claim 12, wherein a dielectric constant of the third insulation layer is higher than a dielectric constant of the first insulation layer.

14. The thin-film transistor array substrate of claim 3, wherein the pixel electrode comprises a transparent conductive oxide.

15. The thin-film transistor array substrate of claim 14, wherein the transparent conductive oxide comprises at least one selected from the group consisting of indium tin oxide (ITO), an indium zinc oxide (IZO), a zinc oxide (ZnO), an indium oxide (In2O3), an indium gallium oxide (IGO), and an aluminum zinc oxide (AZO).

16. The thin-film transistor array substrate of claim 14, wherein the pixel electrode further comprises a semi-transmission metal layer.

17. The thin-film transistor array substrate of claim 16, wherein the semi-transmission metal layer comprises at least one selected from the group consisting of silver (Ag), aluminum (Al), and alloys thereof 18. The thin-film transistor array substrate of claim 16, wherein the semi-transmission metal layer is disposed between layers comprising the transparent conductive oxide.

19. The thin-film transistor array substrate of claim 3, wherein the first protection layer comprises at least one selected from the group consisting of Mo, an alloy comprising Mo, Ti, Cu, and Ag.

20. The thin-film transistor array substrate of claim 19, wherein a connector of the source or drain electrode connected to the pixel electrode is disposed higher than the pixel electrode, and the first protection layer is disposed between the pixel electrode and the connector.

21. A method of manufacturing the thin-film transistor array substrate according to claim 3, the method comprising:
forming the semiconductor layer on the substrate and forming the active layer of the thin-film transistor by patterning the semiconductor layer;
forming the first insulation layer, forming the first conductive layer on the first insulation layer, and then forming the gate electrode of the thin-film transistor and the first electrode of the capacitor by patterning the first conductive layer;
forming the second insulation layer and forming an opening in the second insulation layer such that source and drain regions of the active layer and the first electrode are exposed;
sequentially forming the third insulation layer, the second conductive layer, and the third conductive layer, and forming the pixel electrode and the second electrode of the capacitor by simultaneously patterning the third insulation layer, the second conductive layer, and the third conductive layer;
forming the fourth conductive layer, and forming source and drain electrodes and the second protection layer covering the second electrode by patterning the fourth conductive layer; and
forming the fourth insulation layer and removing the fourth insulation layer such that the pixel electrode is exposed.

22. The method of claim 21, wherein ion impurities are doped on the source and drain regions.

23. The method of claim 21, further comprising performing a first etching process by etching the third insulation layer, and performing a second etching process by etching the second and third conductive layers.

24. The method of claim 21, wherein the third conductive layer remaining on the pixel electrode is removed.

25. The method of claim 21, wherein the fourth conductive layer is used to further form a pad electrode.

26. The method of claim 21, wherein the third insulation layer is thinner than the second insulation layer.

27. The method of claim 21, wherein the third insulation layer is formed of a material having a higher dielectric constant than the first insulation layer.

28. The method of claim 21, wherein the second conductive layer is formed of a layer comprising a transparent conductive oxide.

29. The method of claim 28, wherein the second conductive layer is formed to include a first layer comprising a transparent conductive oxide, a second layer comprising a semi-transmission metal, and a third layer comprising a transparent conductive oxide.

* * * * *